United States Patent
Kim

(10) Patent No.: US 7,476,962 B2
(45) Date of Patent: Jan. 13, 2009

(54) STACK SEMICONDUCTOR PACKAGE FORMED BY MULTIPLE MOLDING AND METHOD OF MANUFACTURING THE SAME

(75) Inventor: Hyun-Ki Kim, Chungcheongnam-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/369,443

(22) Filed: Mar. 6, 2006

(65) Prior Publication Data

US 2006/0197210 A1 Sep. 7, 2006

(30) Foreign Application Priority Data

Mar. 4, 2005 (KR) .................. 10-2005-0018135

(51) Int. Cl.
*H01L 23/02* (2006.01)
(52) U.S. Cl. .............. 257/686; 257/696; 257/E23.048; 257/678; 257/685
(58) Field of Classification Search ................ 257/686, 257/E23.048, 685, 678, 696
See application file for complete search history.

(56) References Cited

U.S. PATENT DOCUMENTS

| | | | | |
|---|---|---|---|---|
| 4,996,587 A | * | 2/1991 | Hinrichsmeyer et al. .... | 257/676 |
| 5,625,221 A | * | 4/1997 | Kim et al. .................... | 257/686 |
| 5,770,888 A | * | 6/1998 | Song et al. ................... | 257/696 |
| 6,020,629 A | * | 2/2000 | Farnworth et al. .......... | 257/686 |
| 6,337,510 B1 | * | 1/2002 | Chun-Jen et al. ............ | 257/666 |
| 6,459,148 B1 | * | 10/2002 | Chun-Jen et al. ............ | 257/692 |

FOREIGN PATENT DOCUMENTS

| | | |
|---|---|---|
| JP | 2001-177005 | 6/2001 |
| KR | 2001-0064914 | 7/2001 |

OTHER PUBLICATIONS

English language abstract of Korean Publication No. 2001-0064914.
English language abstract of Japanese Publication No. 2001-177005.

\* cited by examiner

*Primary Examiner*—Kimberly D Nguyen
*Assistant Examiner*—Mohammad T Karimy
(74) *Attorney, Agent, or Firm*—Marger Johnson & McCollom, P.C.

(57) ABSTRACT

Provided are a stack semiconductor package manufactured by multiple molding that can prevent the breakage due to stress concentration at a connecting portion between separate semiconductor packages and a method of manufacturing the same. The stacked semiconductor packages are combined together through sealing resins by molding them multiple times, resulting in uniform stress distribution across substantially the entire interface between the semiconductor packages.

7 Claims, 10 Drawing Sheets

STACK SEMICONDUCTOR PACKAGE FORMED BY MULTIPLE MOLDING AND METHOD OF MANUFACTURING THE SAME

CROSS-REFERENCE TO RELATED PATENT APPLICATION

This application claims the benefit of Korean Patent Application No. 10-2005-0018135, filed on Mar. 4, 2005, in the Korean Intellectual Property Office, the disclosure of which is incorporated herein in its entirety by reference.

BACKGROUND OF THE INVENTION

1. Field of the Invention

The present invention relates to a semiconductor package and a method of manufacturing the same, and more particularly, to a vertically stacked semiconductor package with improved physical strength and a method of manufacturing the same.

2. Description of the Related Art

As semiconductor devices are used in a wider range of application fields, the importance of semiconductor packages that protect semiconductor chips from mechanical damage and extend their functions to the outside has significantly increased. Semiconductor packages come in various shapes and with various characteristics.

Stack semiconductor packages are designed so that two semiconductor packages are vertically stacked on each other and combined together, thus increasing the memory capacity by a factor of two or more. With this increased capacity, the semiconductor packages can be used in the growing market of large-capacity servers and network applications.

FIG. 1 is a cross-sectional view of a conventional stack semiconductor package 10. Referring to FIG. 1, the conventional stack semiconductor package 10 includes first and second semiconductor packages 20 and 40 that are electrically connected to each other by a conductive adhesive or solder 34 and operates as a single semiconductor package. A method of manufacturing the first semiconductor package 20 involves mounting a first semiconductor chip 26 on a first die pad 22, connecting the first semiconductor chip 26 with inner leads 24 by first wires 28, and molding the first semiconductor package using first sealing resin 30. A method of manufacturing the second semiconductor package 40 includes mounting a second semiconductor chip 46 on a second die pad 42, connecting the second semiconductor chip 46 with inner leads 44 by second wires 48, and molding the second semiconductor package using second sealing resin 50.

However, the conventional stack semiconductor package is susceptible to breakage due to stress concentration at a connecting portion A between the first and second semiconductor packages 20 and 40 in response to changes in the external environment and conditions. This can be easily verified by using a temporal cycle test, which is a reliability test used to examine the physical status of a semiconductor package when being alternately subjected to extremely low and high temperatures.

SUMMARY

In one aspect, the present invention provides a stack semiconductor package formed by multiple molding that can prevent breakage by dispersing stress that tends to concentrate at a connecting portion between discrete semiconductor packages. In another aspect, the present invention provides a method of manufacturing the stack semiconductor package using multiple molding.

According to an embodiment of the present invention, a stack semiconductor package can be manufactured using multiple molding. This stack package includes a first semiconductor package including a first leadframe, a first semiconductor chip, first wires, and a first sealing resin. The stack package also includes a second semiconductor package, which is stacked on the first semiconductor package, and includes a second leadframe, a second semiconductor chip, second wires, and a second sealing resin. The second sealing resin in this embodiment is molded multiple times together with the first sealing resin to combine the second semiconductor package with the first semiconductor package.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. While the present invention will be described below with respect to a semiconductor package using a leadframe, it can be applied to stacked ball grid array (BGA) packages or chip scale packages (CSPs) using a substrate instead of a leadframe.

First Embodiment

FIGS. 2-10 are cross-sectional views illustrating a method of manufacturing a stack semiconductor package using multiple molding according to a first embodiment of the present invention.

Figure 2:
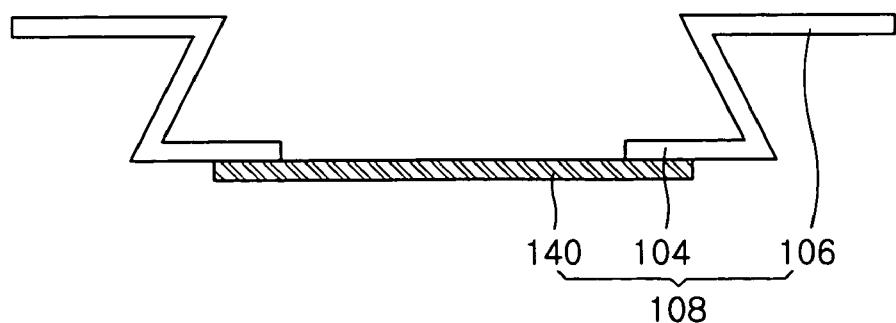
FIGS. 2-10 are cross-sectional views illustrating a method of manufacturing a stack semiconductor package using multiple molding according to a first embodiment of the present invention.

Referring to FIG. 2, a first Z-shaped leadframe 108 is prepared. The first leadframe 108 includes first leads 104, which may be connected with first wires 112 (FIG. 4) in a first semiconductor package 102 (FIG. 7), second leads 106 extending upward from of the first leads 104, and a tape 140 attached to the bottom surfaces of the first leads 104. A portion of the second lead 106 may be exposed even after the first semiconductor package 102 is molded. When a plurality of semiconductor packages are stacked, the second leads 106 provide an electrical path through which the plurality of semiconductor packages are electrically connected to one another. For example, the top surfaces of the second leads 106 in the lead frame 108 can be electrically connected to the bottom surfaces of the first leads 120 of a lead frame 124 (FIG. 7) located above the lead frame 108. A material whose adhesion characteristics vary by ultraviolet (UV) light or heat may suitably be applied on one surface of the tape 140 on which a first semiconductor chip 110 is mounted. The tape 140 will be removed from the first semiconductor package 102 after molding.

Figure 3:
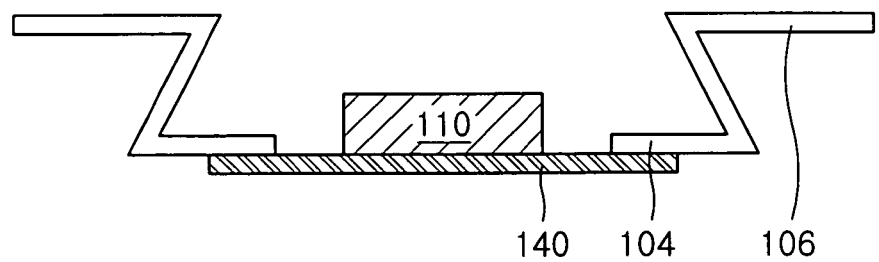
Figure 4:
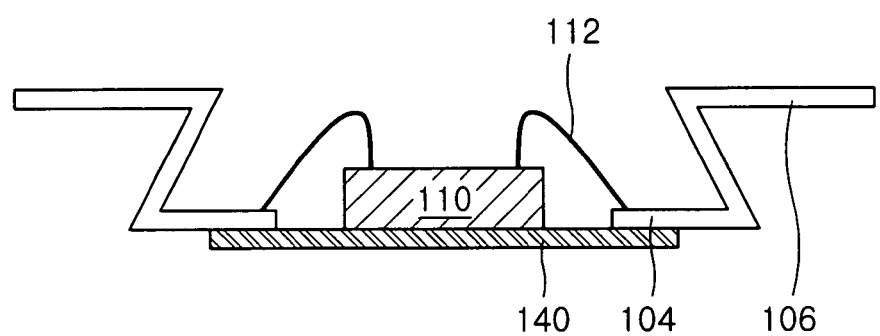

Referring to FIGS. 3 and 4, the first semiconductor chip 110 is mounted on the tape 140 of the first leadframe 108. The first semiconductor chip 110 may be a memory chip that can be suitably stacked to increase the memory capacity. Subsequently, bond pads (not shown) of the first semiconductor chip 110 are coupled to the first leads 104 by first wires 112 such as gold wires.

In this case, the first semiconductor chip 110 and the first leads 104 of the first leadframe 108 in the first semiconductor package 102 are located on substantially the same plane due to use of the tape 140.

While the first semiconductor package 102 has been shown to include the tape 140 and the first semiconductor chip 110 connected to the first leads 104 by wire bonding, other bonding techniques can be used. For example, the semiconductor package may have a chip pad attached to the leadframe 108 instead of the tape 140, thus connecting the semiconductor chip 110 to the first leads 104 by a flip-chip bonding technique using, for example, a bump.

Figure 5:
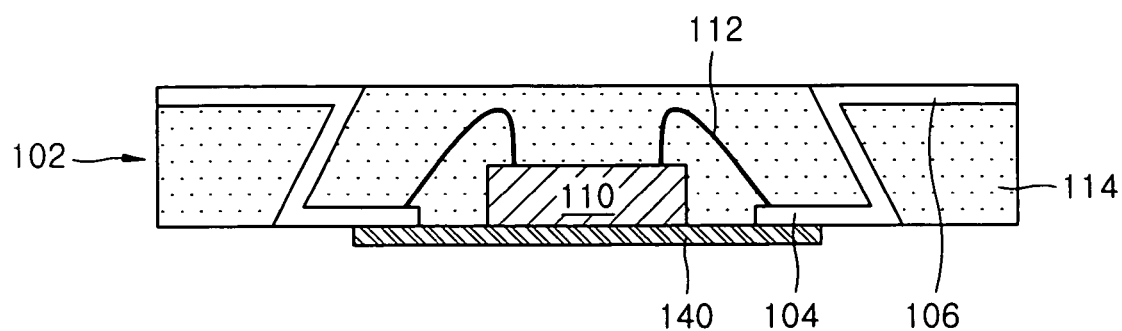
Figure 6:
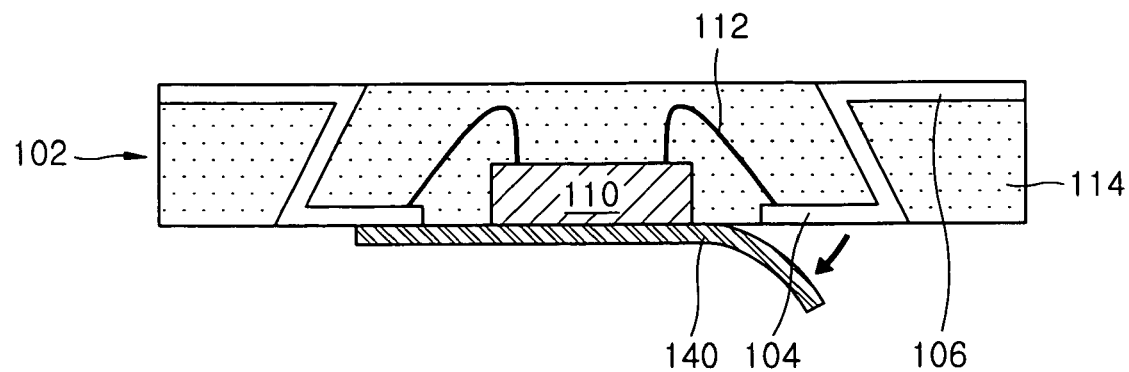

Referring to FIGS. 5 and 6, a first molding process is performed on the resulting structure using first sealing resin 114 such as epoxy mold compound to encapsulate the first semiconductor chip 110, the first wires 112, and a portion of the first leadframe 108 resulting in first semiconductor package 102. In this case, the molding process exposes the bottom surfaces of the first leads 104 and the top surfaces of the second leads 106 outside the first semiconductor package 102. Next, the tape 140 used for mounting the first semiconductor chip 110 may be detached and removed from the first semiconductor package 102.

Figure 7:
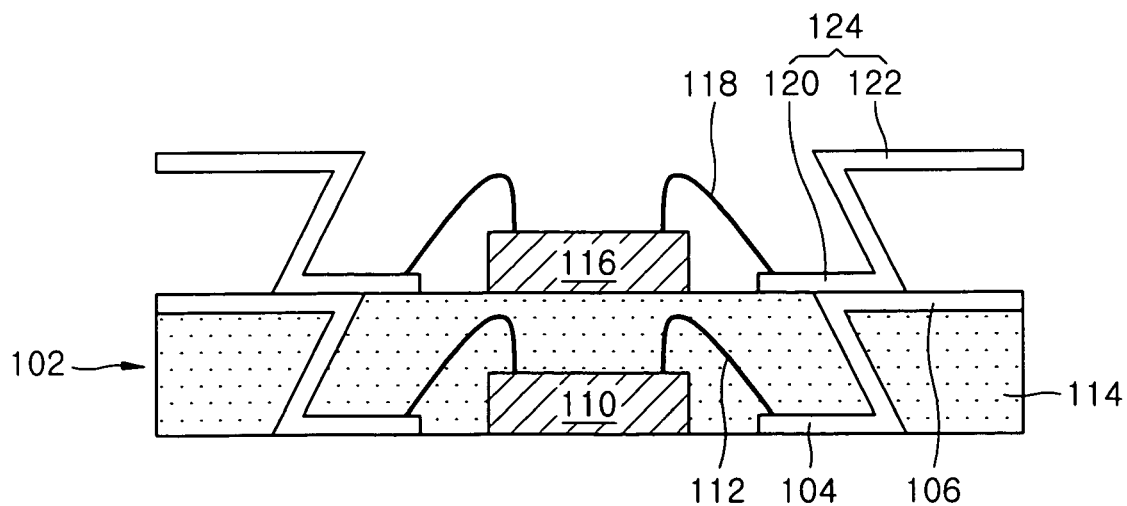

Referring to FIG. 7, the second leadframe 124 is placed on the first semiconductor package 102 using a conductive adhesive, such as a solder paste. Like the first leadframe 108, the second leadframe 124 includes first and second leads 120 and 122. After the second leadframe 124 is attached to the first semiconductor package 102, a second semiconductor chip 116 may be mounted on the first sealing resin 114 by a die attach adhesive such as an epoxy adhesive or adhesive tape. Thereafter, bond pads (not shown) of the second semiconductor chip 116 are bonded to the first leads 120 of the second leadframe 124 by second wires 118 such as gold wires.

Figure 8:
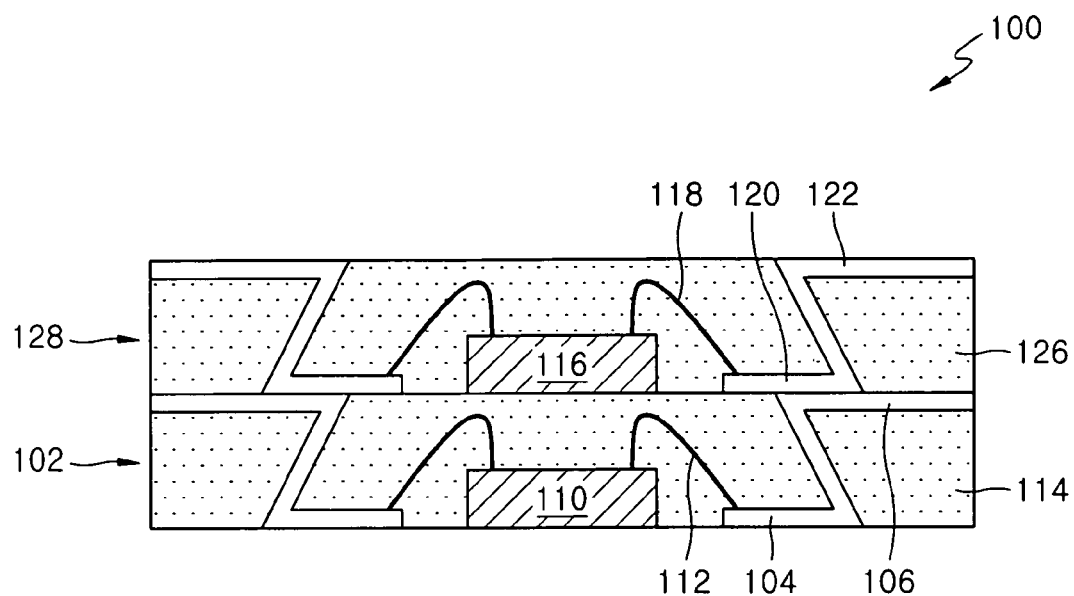

Referring to FIG. 8, a second molding process is performed on the resulting structure in which the bond pads have been connected to the first leads 120 by the wires 118. That is, second sealing resin 126 is introduced to encapsulate the second leadframe 124, the second semiconductor chip 116, and the second wires 118, resulting in a second semiconductor package 128. In this case, the top surfaces of the second leads 122 are exposed outside of the second sealing resin 126 such that another semiconductor package can be stacked on the second semiconductor package 128.

Figure 1:
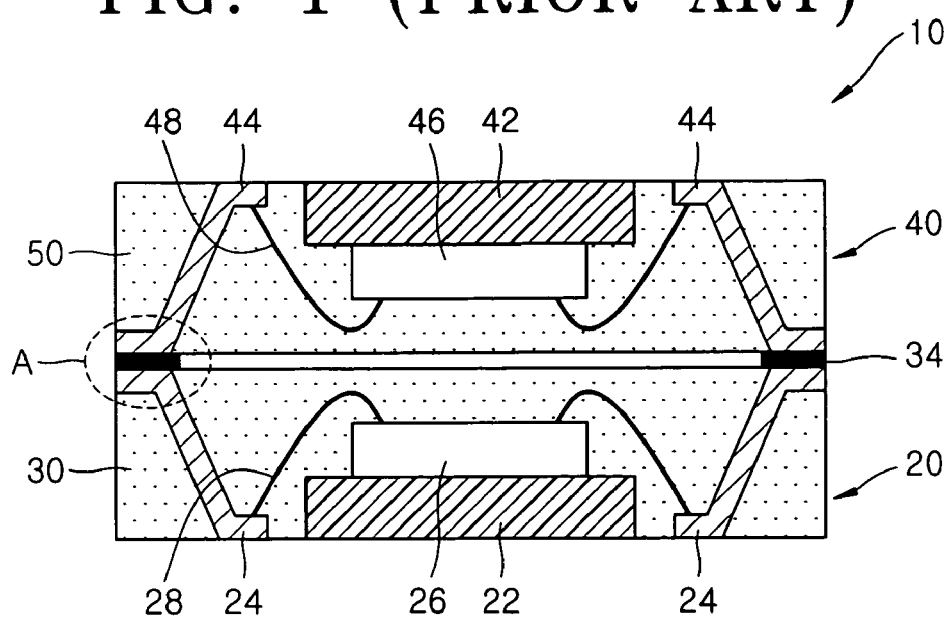
FIG. 1 is a cross-sectional view of a conventional stack semiconductor package.

In a conventional stack semiconductor package, two separately molded semiconductor packages are stacked on each other and connected by attaching only a connecting portion between the two semiconductor packages, i.e., leads of a leadframe using a conductive adhesive such as solder, leaving a space 34 between the two semiconductor packages as shown in FIG. 1. This results in stress concentration at the connecting portion caused in part by changes in the external environment.

Conversely, in the stack semiconductor package 100 according to this embodiment of the present invention, the first sealing resin 114 is molded twice consecutively together with the second sealing resin 126. Thus, the first and second semiconductor packages 102 and 128 are connected by attaching substantially the entire interface between the top of the first semiconductor package 102 and the bottom of the second semiconductor package 128 including a connecting portion between the top surfaces of the second leads 106 of the first leadframe 108 and the bottom surfaces of the first leads 120 of the second leadframe 124 using the first and second sealing resins 114 and 126. Therefore, stress caused by changes in the external environment is uniformly exerted across substantially the entire interface between the first and second semiconductor packages 102 and 128, which prevents the stress from being concentrated at discrete connection points and which may result in less breakage of the stack semiconductor package 100.

Figure 9:
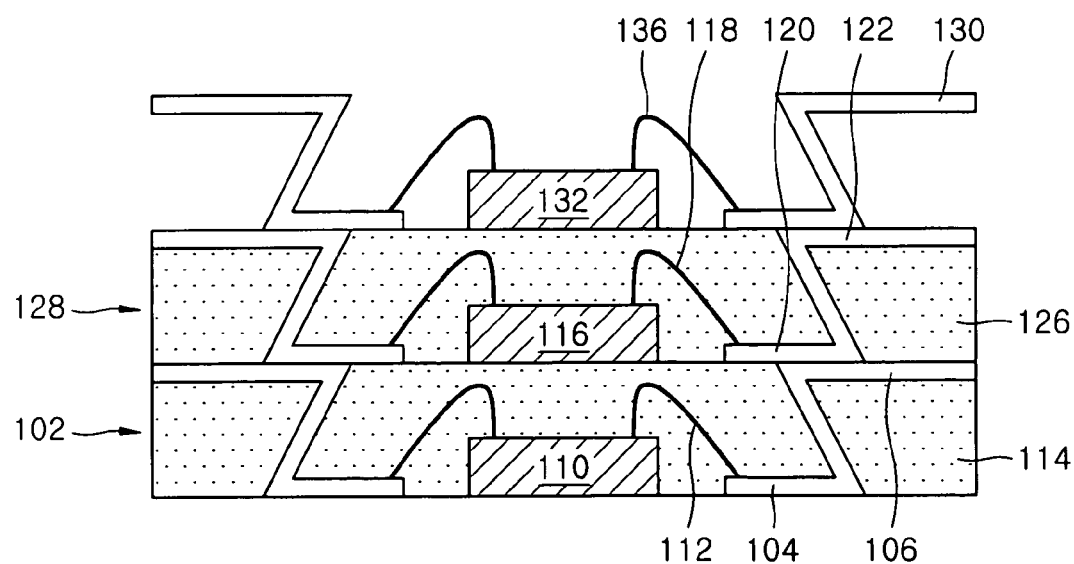
Figure 10:
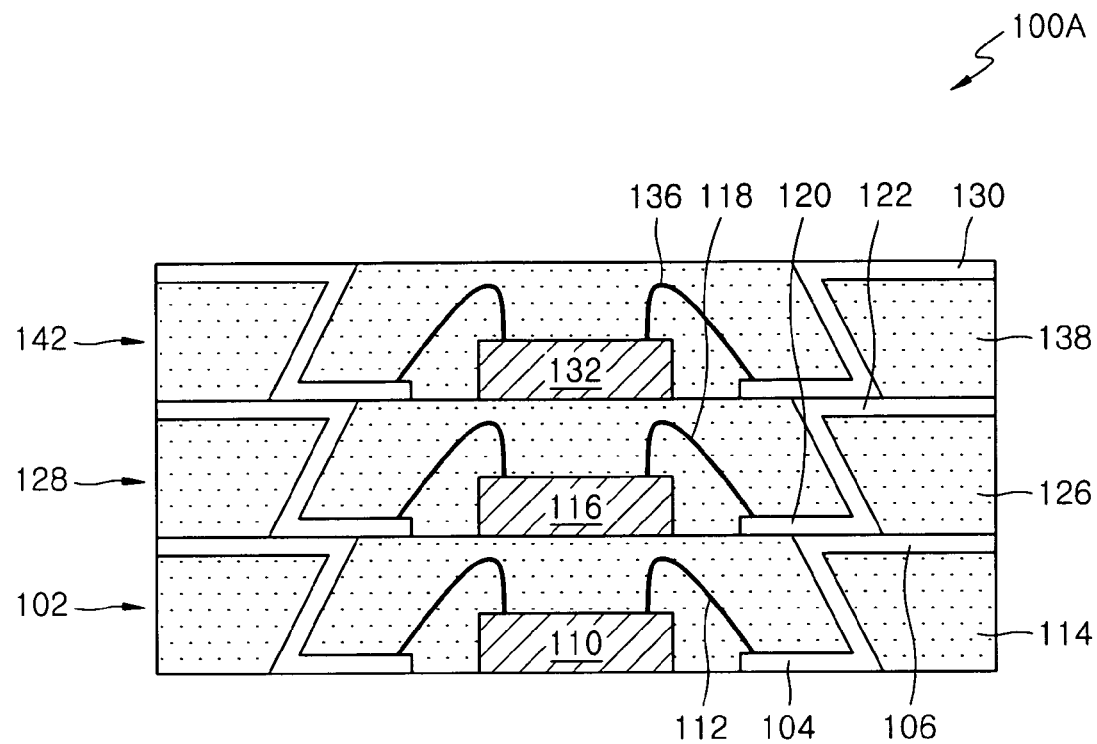

Referring to FIGS. 9 and 10, after a third leadframe 130 is attached onto the stack semiconductor package 100 of FIG. 8 and a third semiconductor chip 132 is mounted on the second sealing resin 126, for example, by a die attach adhesive, the third semiconductor chip 132 is bonded to the third leadframe 130 by, for example, third wires 136. Subsequently, a third sealing resin 138 is introduced to encapsulate the third wires 136, the third semiconductor chip 132, and the third leadframe 130, thereby completing a stack semiconductor package 100*a* in which the three semiconductor packages 102, 128, and 142 are vertically stacked on one another. In the completed stack semiconductor package 100A, the first sealing resin 114 and the second sealing resin 126 are respectively molded three times and twice consecutively. In addition, although three packages are illustrated in FIG. 10, additional semiconductor packages may be added in a similar manner in forming the stack semiconductor package.

Second Embodiment

Figure 11:
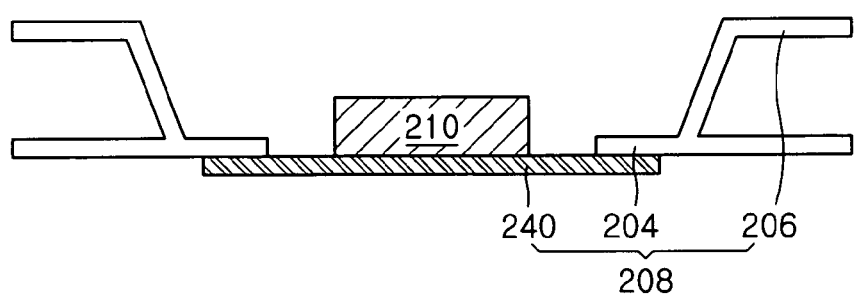
FIGS. 11 and 12 are cross-sectional views illustrating a method of manufacturing a stack semiconductor package using multiple molding according to a second embodiment of the present invention.
Figure 12:
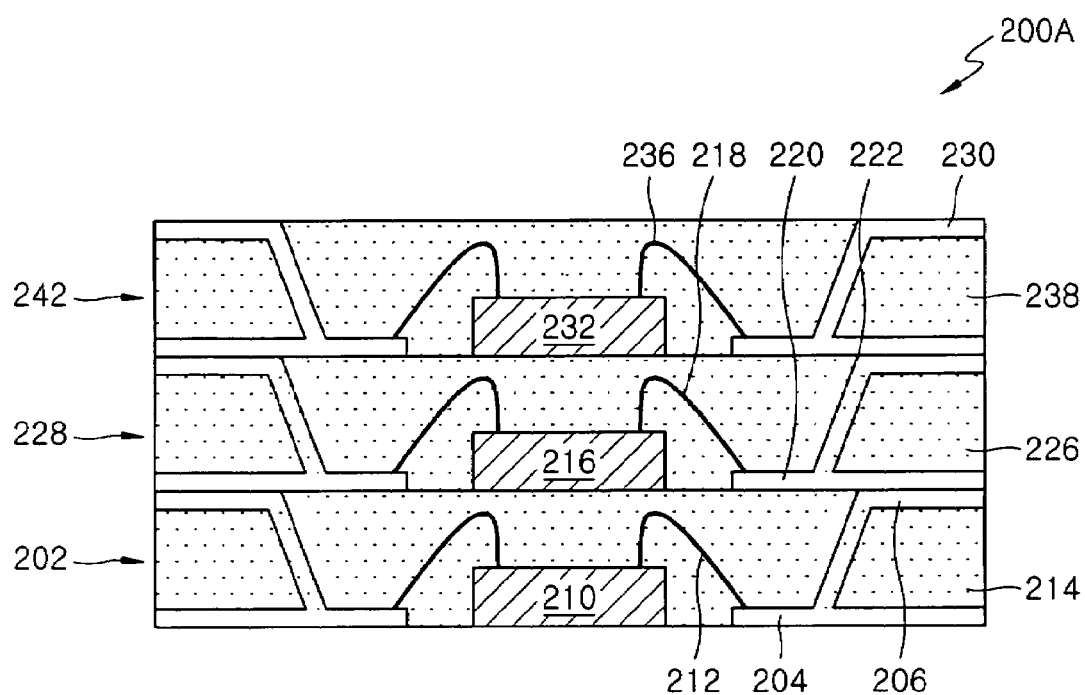

FIGS. 11 and 12 are cross-sectional views illustrating a method of manufacturing a stack semiconductor package 200A using a multiple molding technique according to a second embodiment of the present invention. While the leadframes in the stack semiconductor package 100A are Z-shaped, it may have various other shapes like the shape of the first leadframe 208 shown in FIG. 11. Additionally, the first lead 204 may have various other shapes to allow wire bonding to the first semiconductor chip 210 and to allow the tape 240 to extend between the leadframes 208. The second lead 206 may also have any variety of shapes such that it can connect to the first lead 204 and extend upwards.

Referring to FIG. 12, a first semiconductor package 202 is manufactured according to the same or similar method as in the first embodiment using the first leadframe 208. Subsequently, second and third semiconductor packages 228 and 242 are sequentially manufactured by multiple molding using second sealing resin 226 and third sealing resin 238, thus completing a stack semiconductor package 200A in which the three semiconductor packages 202, 228, and 242 are vertically stacked.

Next, the structures of the stack semiconductor packages 100A and 200A manufactured according to the first and second embodiments of the present invention will be described with reference to FIGS. 10 and 12.

The stack semiconductor package 100A (200A) includes the first semiconductor package 102 (202) incorporating the first leadframe 108 (208), the first semiconductor chip 110 (210), the first wires 112 (212), and the first sealing resin 114 (214). The second semiconductor package 128 (228), which is stacked on the first semiconductor package 102 (202), incorporates the second leadframe 124 (220, 222), the second semiconductor chip 116 (216), the second wires 118 (218), and the second sealing resin 126 (226) which is molded multiple times together with the first sealing resin 114 (214) to form a continuous molding structure. If necessary, the stack semiconductor package 100A (200A) may further include a third semiconductor package 142 (242) stacked on top of the second semiconductor package 128 (228) using multiple molding.

Third Embodiment

FIGS. 13-18 are cross-sectional views illustrating a method of manufacturing a stack semiconductor package 300 using multiple molding according to a third embodiment of the present invention.

While the first and second embodiments use a separate leadframe for each semiconductor package, the present embodiment uses a common leadframe 308 for a stack semiconductor package including two semiconductor packages.

Figure 13:
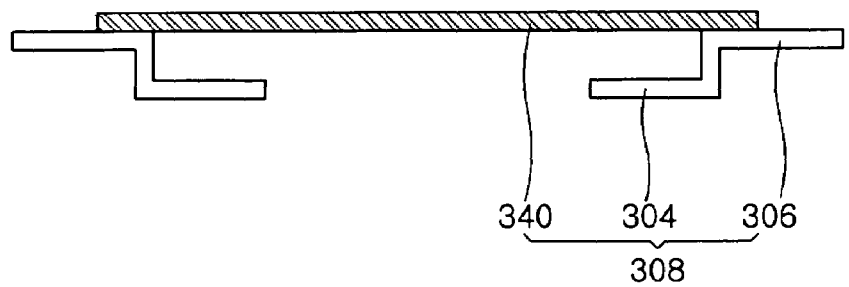
FIGS. 13-18 are cross-sectional views illustrating a method of manufacturing a stack semiconductor package using multiple molding according to a third embodiment of the present invention.
Figure 14:
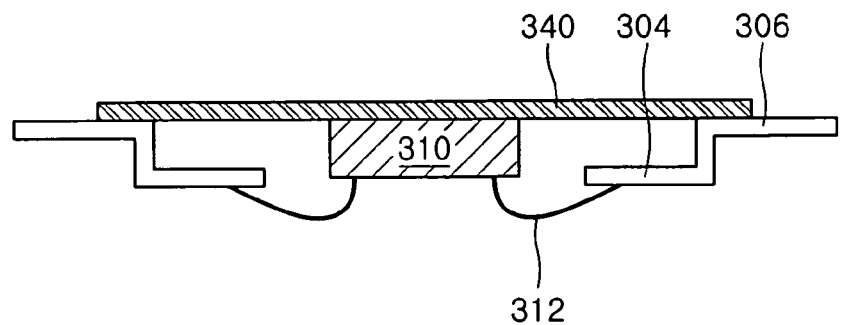
Figure 15:
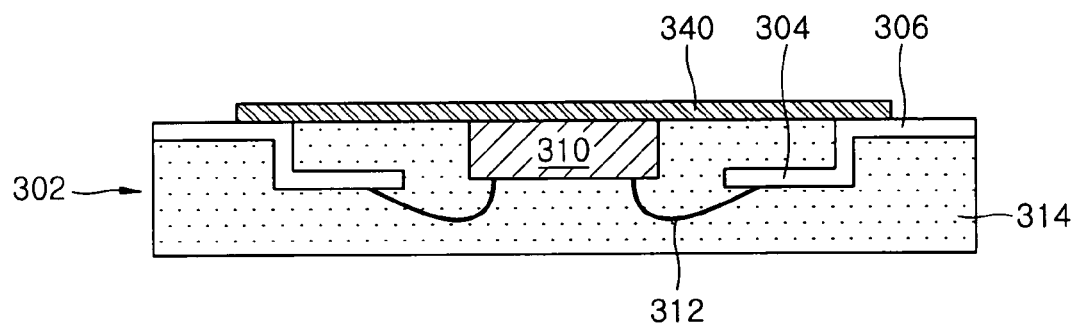
Figure 16:
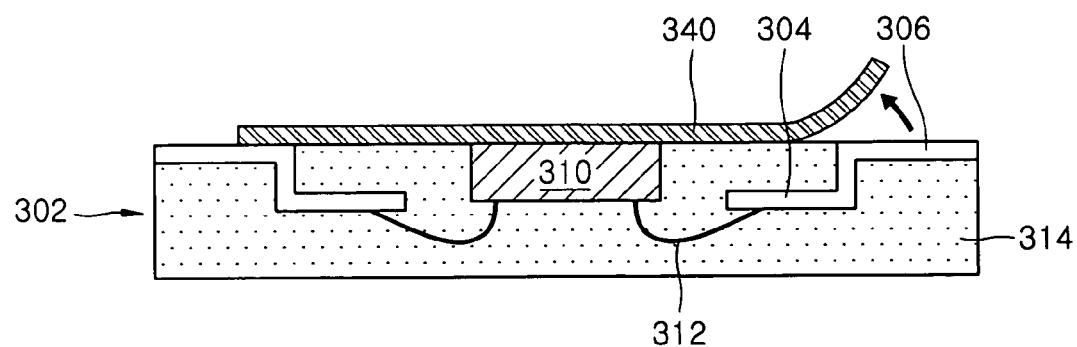
Figure 17:
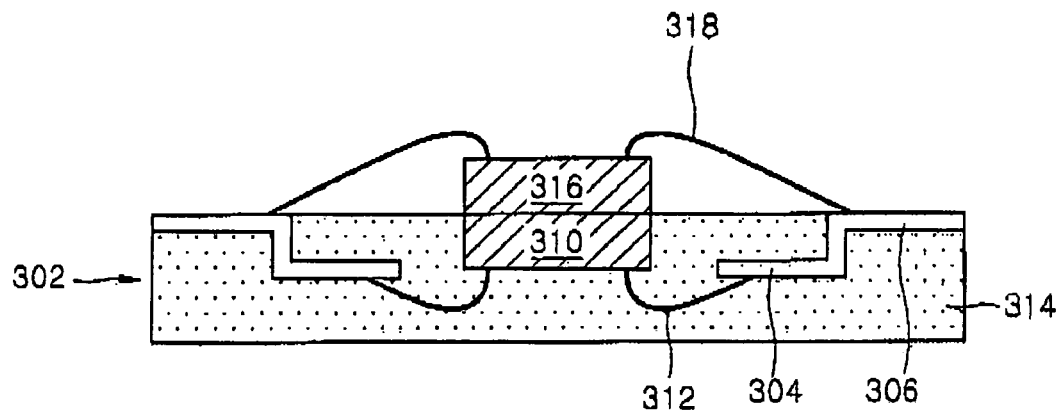
Figure 18:
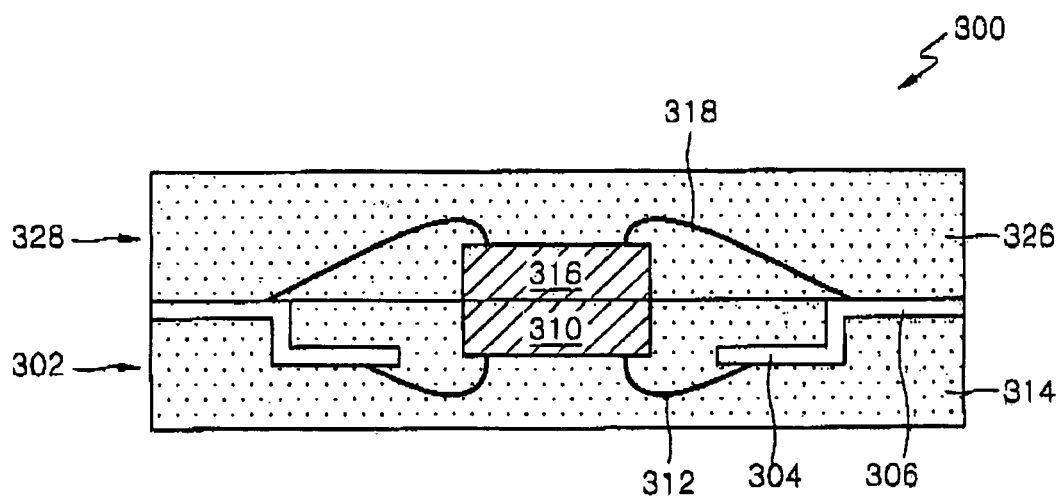

Referring to FIG. 13, the common leadframe 308 includes first and second leads 304 and 306 connected in a stepped pattern. A tape 340 is attached to the top surfaces of the second leads 306 and provides a space for mounting a first semiconductor chip. The first and second leads 304 and 306 will be connected to first and second wires.

Referring to FIGS. 14-18, after a first semiconductor chip 310 is mounted on the tape 340 of the common leadframe 308, bond pads (not shown) of the first semiconductor chip 310 are coupled to the first leads 304 by, for example, first wires 312 such as gold wires.

Subsequently, a molding process is performed on the resulting structure using a first sealing resin 314 to encapsulate the common leadframe 308, the first semiconductor chip 310, and the first wires 312. Thereafter, the tape 340 is detached and removed to complete a first semiconductor package 302. Thus, portions of the second leads 306 and first semiconductor chip 310 are exposed outside the first sealing resin 314. A second semiconductor chip 316 is mounted on the bottom of the first semiconductor chip 310 using an adhesive such as an epoxy and bond pads of the second semiconductor chip 316 are coupled to the second leads 306 by, for example, second wires 318.

Lastly, a molding process is performed again on the resulting structure using second sealing resin 326 to complete a second semiconductor package 328. That is, the first sealing resin 302 is molded twice consecutively with the second sealing resin 326 such that the first semiconductor package 302 is combined with the second semiconductor package 328 using the first and second sealing resins 314 and 326. Therefore, stress caused by changes in the external environment is exerted uniformly across substantially the entire interface between the first and second semiconductor packages 302 and 328.

Fourth Embodiment

FIGS. 19-23 are cross-sectional views illustrating a method of manufacturing a stack semiconductor package 400 using multiple molding according to a fourth embodiment of the present invention.

Figure 19:
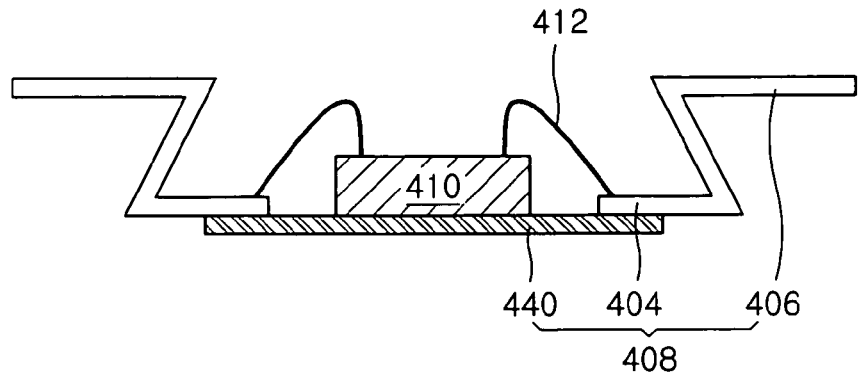
FIGS. 19-23 are cross-sectional views illustrating a method of manufacturing a stack semiconductor package using multiple molding according to a fourth embodiment of the present invention.

Referring to FIG. 19, after a common Z-shaped leadframe 408 is prepared, a first semiconductor chip 410 is mounted on a tape 440 of the common leadframe 408. Thereafter, bond pads (not shown) of the first semiconductor chip 410 are bonded to first leads 404 by first wires 412.

Figure 20:
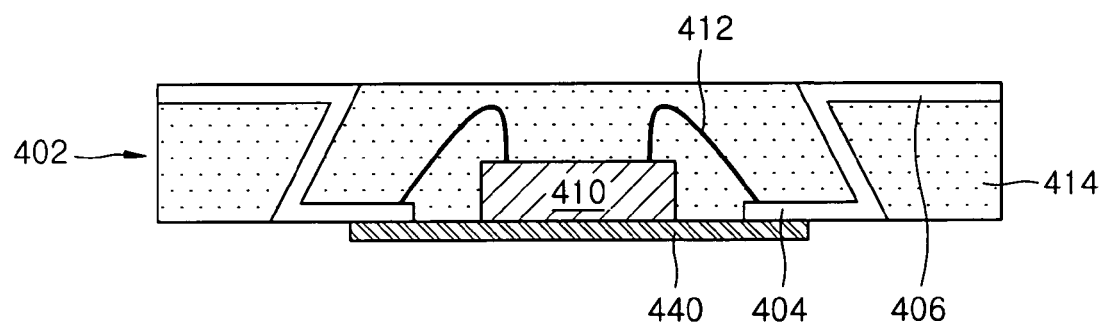
Figure 21:
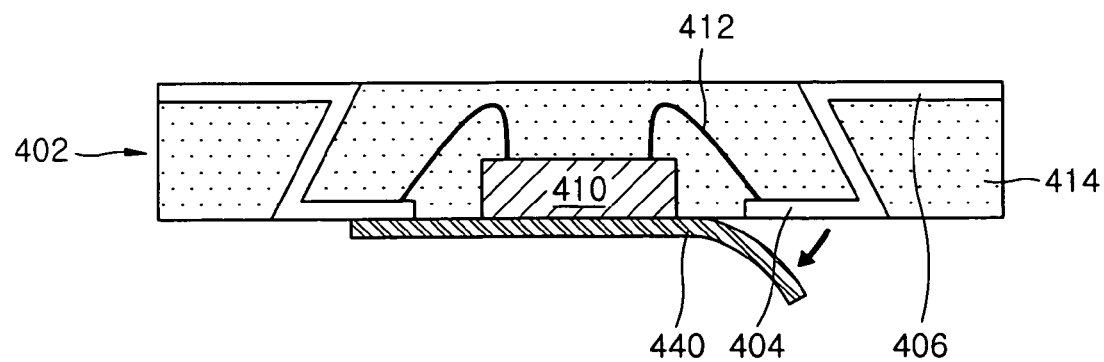

Referring to FIGS. 20 and 21, a molding process is performed using first sealing resin to encapsulate the common leadframe 408, the first semiconductor chip 410, and the first wires 412, thereby completing a first semiconductor package 402. After the molding process, the tape 440 of the common leadframe 408 is detached and removed. Thus, the bottom surfaces of the first leads 404 and the top surfaces of the second leads 406 are exposed outside the first sealing resin 414.

Figure 22:
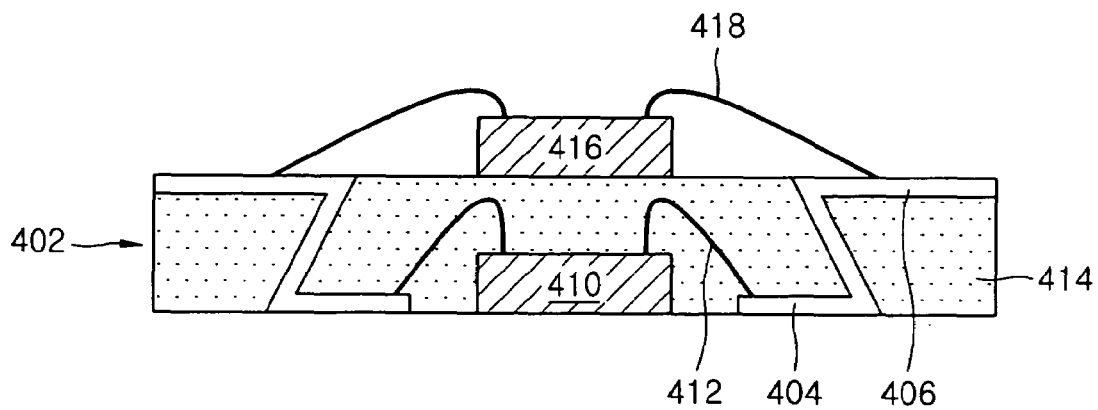
Figure 23:
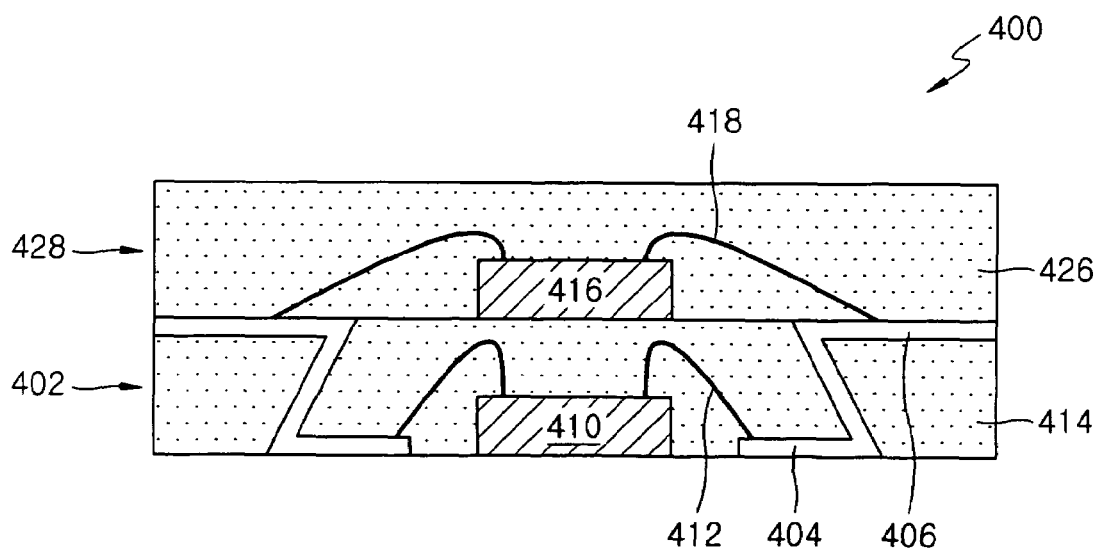

Referring to FIGS. 22 and 23, a second semiconductor chip 416 is mounted on the first sealing resin 414 using a die attach adhesive (not shown). Next, bond pads (not shown) of the second semiconductor chip 416 are bonded to second leads 406 of the common leadframe 408 by second wires 418. A molding process is subsequently performed again on the resulting structure using second sealing resin 426 to seal the second semiconductor chip 416 and the second wires 418, thereby completing a second semiconductor package 428.

The structures of the stack semiconductor packages 300 and 400 manufactured according to the third and fourth embodiments of the present invention will now be described with reference to FIGS. 18-23. The stack semiconductor package 300 (400) includes the first semiconductor package 302 (402) incorporating the common leadframe 308 (408), the first semiconductor chip 310 (410), the first wires 312 (412), and the first sealing resin 314 (414). The second semiconductor package 328 (428) is stacked on and combined with the first semiconductor package 302 (402) using the second sealing resin 326 (426). The second semiconductor package 328 (428) includes the second semiconductor chip 316 (416), the second wires 318 (418), and the second sealing resin 326 (426) molded multiple times together with the first sealing resin 314 (414).

As described above, the stack semiconductor package according to some embodiments of the present invention uses multiple molding to connect separate semiconductor packages along substantially the entire interface between the separate semiconductor packages including a connecting portion using sealing resin, thereby preventing breakage due to stress concentration at the connecting portion in response to changes in the external environment.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A stack semiconductor package, comprising:
  a first semiconductor package including a first leadframe, a first semiconductor chip, first wires, and a first sealing resin, wherein a bottom surface of the first semiconductor chip is exposed from a lower surface of the first semiconductor package; and a second semiconductor package including a second semiconductor chip, second wires, and a second sealing resin, wherein the second semiconductor package is stacked on the first semiconductor package, the second semiconductor chip of the second semiconductor package being in contact with the first sealing resin of the first semiconductor package and the second sealing resin being molded together with the first sealing resin, the second semiconductor package combined with the first semiconductor package using the second sealing resin, wherein the second semiconductor package further includes a second leadframe vertically stacked on a portion of a surface of the first leadframe, wherein the first and second leadframes respectively comprise first leads coupled to the first and second semiconductor chips by first and second wires, respectively, and second leads coupled to the first leads and extending upwards such that the stacked semiconductor packages are electrically connected to each other, and wherein top surfaces of the second leads in the first leadframe are electrically connected to bottom surfaces of the first leads in the second leadframe.

2. The stack semiconductor package of claim 1, wherein the second leadframe of the second semiconductor package has substantially the same shape as the first leadframe of the first semiconductor package.

3. The stack semiconductor package of claim 1, wherein the first semiconductor chip is located on substantially the same plane as the first leads of the first leadframe.

4. The stack semiconductor package of claim 1, further comprising a third semiconductor package including a third leadframe, a third semiconductor chip, third wires, and a third sealing resin, the third semiconductor package stacked on the second semiconductor package, wherein the third sealing resin is molded together with the first and second sealing resins to combine the third semiconductor package with the first and second semiconductor packages.

5. A stack semiconductor package, comprising:
a first semiconductor package including
a first semiconductor chip,
a first leadframe comprising first leads formed on substantially the same plane as the first semiconductor chip and second leads extending upward from the first leads,
first bonding wires connecting the first leads to the first semiconductor chip, and
a first sealing resin formed over the first semiconductor chip and the first lead frame, wherein top surfaces of the second leads are exposed from an upper surface of the first sealing resin and bottom surfaces of the first leads are exposed from a lower surface of the first sealing resin; and a second semiconductor package stacked on the first semiconductor package, the second semiconductor package including
a second semiconductor chip having a bottom surface in contact with the top surface of the first sealing resin,
a second leadframe comprising third leads formed on substantially the same plane as the second semiconductor chip and fourth leads extending upward from the third leads, wherein bottom surfaces of the third leads are in contact with the top surfaces of the second leads,
second bonding wires connecting the second leads to the second semiconductor chip, and
a second sealing resin formed over the second semiconductor chip and second lead frame, wherein top surfaces of the fourth leads are exposed from an upper surface of the second sealing resin, the second semiconductor package being combined with the first semiconductor package using the second sealing resin;

wherein the second and fourth lead each extend upward in a Z-shape.

6. The stack semiconductor package of claim 5, wherein the second leads of the first and second leadframe extend upward in a Z-shape.

7. A stack semiconductor package, comprising:
a first semiconductor package including a first semiconductor chip, a first leadframe comprising first leads coupled to the first semiconductor chip by first wires and second leads coupled to the first leads and extending upwards, and a first sealing resin; and a second semiconductor package including a second semiconductor chip, a second leadframe comprising third leads coupled to the second semiconductor chip by second wires and fourth leads coupled to the third leads and extending upwards, and a second sealing resin, wherein the second semiconductor package is stacked on the first semiconductor package, the second sealing resin being molded together with the first sealing resin, the second semiconductor package combined with the first semiconductor package using the second sealing resin, and wherein top surfaces of the second leads in the first leadframe are electrically connected to bottom surfaces of the third leads in the second leadframe.

* * * * *